United States Patent
Chen et al.

(10) Patent No.: US 9,233,844 B2
(45) Date of Patent: Jan. 12, 2016

(54) GRADED ALUMINUM—GALLIUM—NITRIDE AND SUPERLATTICE BUFFER LAYER FOR III-V NITRIDE LAYER ON SILICON SUBSTRATE

(75) Inventors: Chi-Ming Chen, Zhubei (TW); Po-Chun Liu, Hsinchu (TW); Chung-Yi Yu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 177 days.

(21) Appl. No.: 13/534,368

(22) Filed: Jun. 27, 2012

(65) Prior Publication Data

US 2014/0001439 A1   Jan. 2, 2014

(51) Int. Cl.
| | |
|---|---|
| H01L 31/00 | (2006.01) |
| B82Y 10/00 | (2011.01) |
| B82Y 40/00 | (2011.01) |
| H01L 21/02 | (2006.01) |
| H01L 29/10 | (2006.01) |
| H01L 29/20 | (2006.01) |
| H01L 29/66 | (2006.01) |
| H01L 29/778 | (2006.01) |

(52) U.S. Cl.
CPC ............. B82Y 10/00 (2013.01); B82Y 40/00 (2013.01); H01L 21/0251 (2013.01); H01L 21/0254 (2013.01); H01L 21/02381 (2013.01); H01L 21/02458 (2013.01); H01L 21/02507 (2013.01); H01L 29/1075 (2013.01); H01L 29/2003 (2013.01); H01L 29/66462 (2013.01); H01L 29/7786 (2013.01)

(58) Field of Classification Search
CPC ... H01L 33/06; H01L 33/32; H01L 29/66462; B82Y 20/00; A01B 12/006
USPC .......................................... 257/22, 18, 98, 190
See application file for complete search history.

(56) References Cited

U.S. PATENT DOCUMENTS

| | | | | |
|---|---|---|---|---|
| 5,679,965 | A | * | 10/1997 | Schetzina ..................... 257/103 |
| 6,455,870 | B1 | * | 9/2002 | Wang .................... B82Y 20/00 257/103 |
| 7,112,830 | B2 | | 9/2006 | Munns |
| 7,547,925 | B2 | | 6/2009 | Wong et al. |
| 7,598,108 | B2 | | 10/2009 | Li et al. |
| 2004/0195562 | A1 | * | 10/2004 | Munns .............................. 257/1 |
| 2007/0108456 | A1 | | 5/2007 | Wong et al. |
| 2008/0123698 | A1 | * | 5/2008 | Takata et al. .................... 372/22 |
| 2009/0008647 | A1 | * | 1/2009 | Li et al. .......................... 257/76 |
| 2009/0289270 | A1 | * | 11/2009 | Hanawa ................. C30B 25/02 257/98 |
| 2011/0168979 | A1 | * | 7/2011 | Shur .................... B82Y 20/00 257/18 |

OTHER PUBLICATIONS

U.S. Appl. No. 13/308,997, filed Dec. 1, 2011.

* cited by examiner

*Primary Examiner* — Dale E Page
(74) *Attorney, Agent, or Firm* — Eschweiler & Associates, LLC (57) ABSTRACT

The present disclosure is directed to an integrated circuit and a method for the fabrication of the integrated circuit. The integrated circuit includes a lattice matching structure. The lattice matching structure can include a first buffer region, a second buffer region and a superlattice structure formed from $Al_xGa_{1-x}N/Al_yGa_{1-y}N$ layer pairs.

20 Claims, 6 Drawing Sheets

GRADED ALUMINUM—GALLIUM—NITRIDE AND SUPERLATTICE BUFFER LAYER FOR III-V NITRIDE LAYER ON SILICON SUBSTRATE

BACKGROUND

The deposition of gallium nitride (GaN) films on silicon substrates is difficult because of a large thermal expansion coefficient mismatch between the two materials. Most deposition techniques involve the deposition of buffer layers or stress-relief layers with a distinct composition that is different from that of the substrate and that of GaN. These techniques result in GaN films which are under tensile stress at room temperature. Tensile stress favors the formation of macroscopic cracks in the GaN, which are detrimental to devices fabricated thereon.

DETAILED DESCRIPTION

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

Group III-V nitride materials, such as GaN, are semiconductor compounds having a number of attractive properties making them useful in many microelectronic applications. Generally, they are grown as a single crystal (epitaxial) layer on a suitable substrate, with the substrate influencing the epitaxial growth mechanism. Substrates suitable for facilitating heteroepitaxial growth of gallium nitride are difficult to identify.

Sapphire ($Al_2O_3$), silicon carbide and silicon have all been used as substrates for gallium nitride deposition, but differences in the respective properties of the substrate and can limit the quality of the resulting Group III-V nitride layers. GaN has a different thermal coefficient of expansion from the above substrates, and hence, upon cooling after processing, the GaN layers have a tendency to crack due to the constraints placed upon them by the thicker substrate layers. Cracking in gallium nitride layers severely limits their end use applications.

Another problem associated with difficulty in epitaxial growth is that the crystal lattice parameters of the substrate and the GaN must be identical or reasonably close. The substrate surface structure and orientation strongly influences the quality of the resulting GaN layer and, if there is not a good lattice parameter match, this will lead to the formation of numerous dislocations and to a loss of fine control of the GaN structure. The formation of such defects detrimentally affects the resulting electronic and/or optical properties of the single crystal and again limits the end use applications.

Current techniques have been developed for preventing crack formation and defect formation, including ones involving the use of transition or buffer layers. One strategy for the reduction of threading dislocations in heteroepitaxial systems is the use of an amorphous, or polycrystalline, buffer layer. It has also been shown that the use of transition or buffer layers with graded or stepped composition may be used to realize high quality heteroepitaxial structures. The role of the graded or stepped layers is to introduce strain gradually, and thus provide an opportunity for dislocations to move. This, in turn, reduces the number of dislocations that penetrate the layer surface, by extending the length of each misfit dislocation and promoting the annihilation of their threading segments. Various techniques using transition layers for the direct epitaxial growth of gallium nitride materials on silicon, have employed layers comprising compositionally graded Al and In alloys of GaN, but with limited success.

Figure 1A:
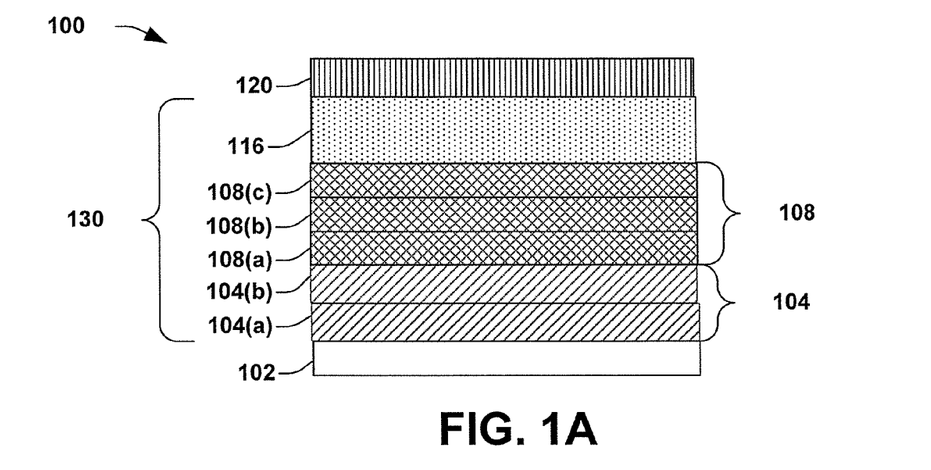
FIG. 1 illustrates a partial cross sectional view of an embodiment of an integrated circuit in accordance with the disclosure.

Accordingly, referring to FIG. 1, the present disclosure is directed to an integrated circuit 100 and method for the fabrication of the integrated circuit 100. The integrated circuit 100 includes a lattice matching structure 130 configured to interface a first lattice structure of a silicon substrate 102 and a second lattice structure of a Group III nitride layer 120. The lattice matching structure 130 includes a first buffer region 104 overlying the substrate 102 and a second buffer region 108 overlying the first buffer region 104. The lattice matching structure 130 further includes a superlattice structure 116 formed from $Al_xGa_{1-x}N/Al_yGa_{1-y}N$ layer pairs. The group III nitride layer 120 overlying the superlattice structure 116 of the lattice matching structure 130 can be GaN.

First buffer region 104 includes a first aluminum nitride (AlN) layer 104(a) formed at a first temperature and a second AlN layer 104(b) formed at a second temperature that is higher than the first temperature. Second buffer region 108 comprises a plurality of graded $Al_xGa_{1-x}N$ layers.

Figure 1B:
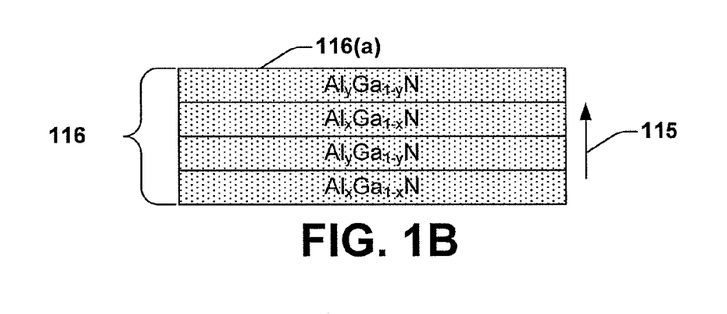

The superlattice structure 116 is made of two semiconductor materials with different band gaps. As shown in FIG. 1B, the two different semiconductor materials in the superlattice structure 116 are deposited alternately on each other to form a periodic structure in the growth direction 115 (e.g., perpendicular to upper surface 116(a). In some embodiments, the superlattice structure 116 includes alternating layers of $Al_xGa_{1-x}N$ and $Al_yGa_{1-y}N$, where two adjacent layers of $Al_xGa_{1-x}N$ and $Al_yGa_{1-y}N$ can be referred to as a "layer pair".

Figure 2:
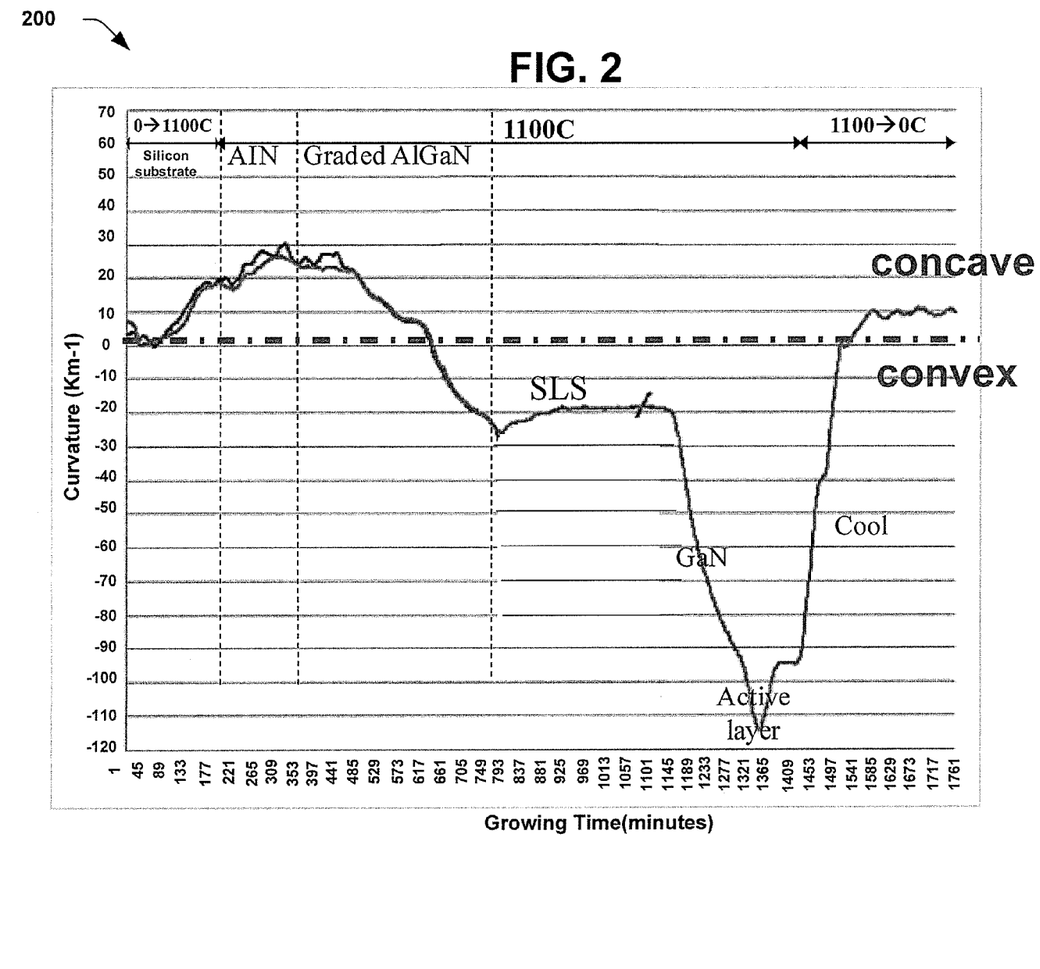
FIG. 2 illustrates a graph depicting the compressive stress induced as GaN is heteroepitaxially grown on a silicon substrate.

Referring to FIG. 2, there is illustrated a graph 200 indicating the compressive stress induced as GaN is heteroepitaxially grown on the silicon substrate. Owing to the thermal mismatch between silicon and GaN, wafer deformation occurs during heating and subsequent cooling of the substrate. However, the lattice matching structure 130 and super lattice structure 116 (indicated as "SLS") of the present disclosure alleviate compressive stresses such that wafer deformation is small to nearly zero.

Figure 3A:
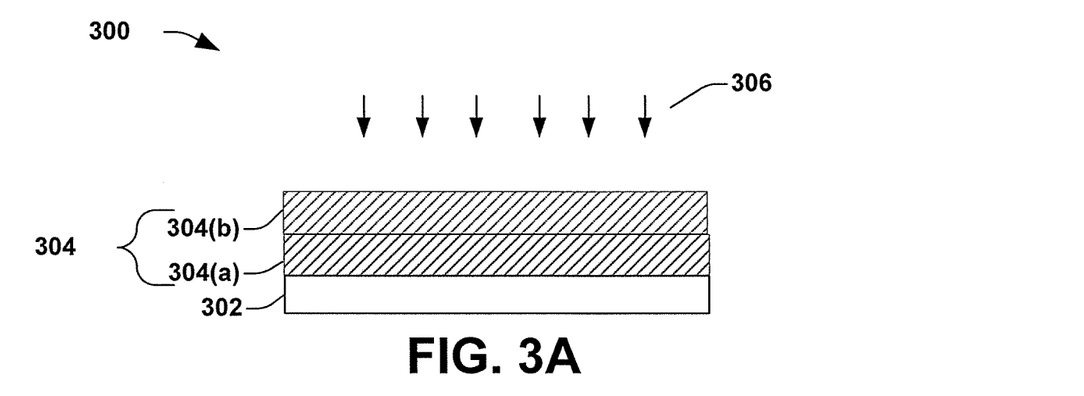
FIGS. 3A-3G are partial cross sectional views illustrating steps of forming an embodiment of FIG. 1.

FIGS. 3A-3G illustrate a plurality of partial cross section diagrams illustrating a manufacturing method forming an integrated circuit 300 according to the disclosure. In FIG. 3A, a substrate 302 having a first lattice structure is provided. When substrate 302 comprises a silicon substrate, it preferably has a (111) surface orientation, although silicon substrates with other surface orientations such as (100) and (110)

are also usable. In one embodiment, the substrate is from about 800 nm (nanometers) to about 2000 nm thick.

It will be appreciated that "semiconductor substrate" as referred to herein may comprise any type of semiconductor material including a bulk silicon wafer. Further, the term semiconductor substrate can also encompass structures that include non semiconductor materials such as oxide in silicon-on-insulator (SOI), partial SOI substrate, polysilicon, amorphous silicon, or organic materials, among others. In some embodiments, semiconductor substrates can also include multiple wafers or dies which are stacked or otherwise adhered together. Semiconductor substrates can include wafers which are cut from a silicon ingot, and/or any other type of semiconductor/non-semiconductor and/or deposited or grown (e.g. epitaxial) layers formed on an underlying substrate.

A deposition process 306 is then performed to form a first buffer region 304 of a lattice-matching structure (330 in FIG. 1D). First buffer region 304 includes a first layer 304(a) of AlN which is formed at a first temperature. Thus, in one embodiment, the first layer 304(a) of AlN can be a low temperature AlN (LT-AlN) that can be formed at a temperature of from about 900° C. up to about 1000° C. In one embodiment, the LT-AlN 304(a) will be formed at a thickness of from about 20 nm to about 80 nm. The deposition process 306 can include, in one embodiment, a metal-organic chemical vapor deposition (MOCVD) process.

A second layer 304(b) of AlN is then formed by deposition process (not shown) over first layer 304(a) to complete formation of the first buffer region 304 of the lattice-matching structure, as illustrated in FIG. 3A. The second layer 304(b) of AlN is formed at a second temperature which is higher than the first temperature for formation of the first layer 304(a). Thus, in one embodiment, the second layer of AlN 304(b) can be a high temperature AlN (HT-AlN) that can be formed at a temperature of from about 1000° C. to about 1300° C. and at a thickness of from about 50 nm to about 200 nm in one embodiment.

Figure 3B:
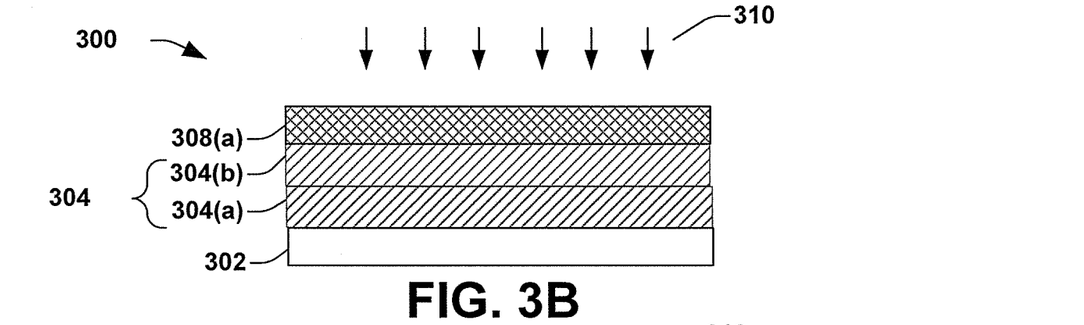

Formation of second buffer region (308 in FIG. 3C) by process 310 is then begun in FIG. 3B in which a plurality of graded $Al_xGa_{1-x}N$ layers are formed overlying first buffer region 304. In one embodiment, the plurality of graded $Al_xGa_{1-x}N$ layers comprises about three layers. A first layer 308(a) of graded $Al_xGa_{1-x}N$ is illustrated in FIG. 3B. First layer 308(a) has a total thickness of about 50 nm to about 200 nm and can be formed by, for example, an MOCVD process, at a temperature of from about 1000° C. to about 1200° C.

Figure 3C:
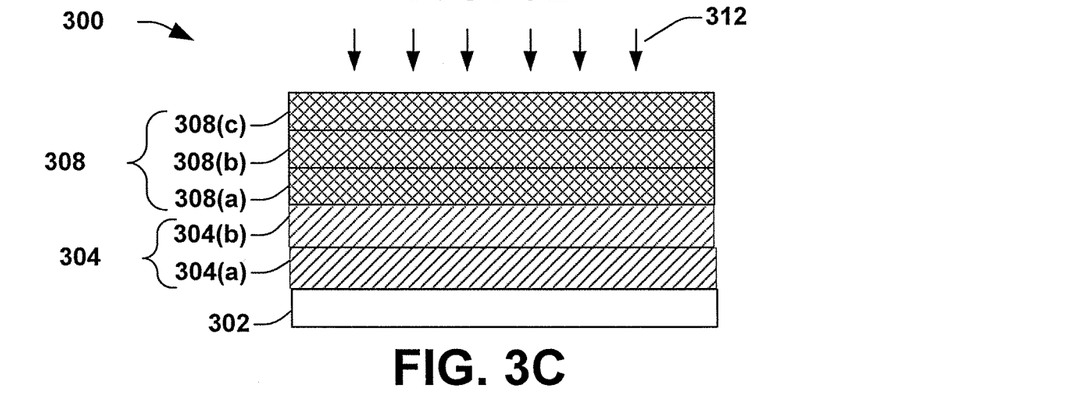

Second 308(b) and third 308(c) graded $Al_xGa_{1-x}N$ layers are formed as illustrated in FIG. 3C by process 312. Second layer 308(b) can be formed, in one embodiment, at a temperature of from about 1000° C. to about 1200° C. and have a total thickness of from about 150 nm to about 250 nm. Third layer 308(c) can be formed, in one embodiment, at a temperature of from about 1000° C. to about 1200° C. and have a total thickness of from about 350 nm to about 600 nm.

By "graded" $Al_xGa_{1-x}N$ second buffer region 308, it is meant that the relative amounts of the respective aluminum content will change with depth in the second buffer region throughout the total thickness of the buffer layer. The relative amounts may change so as gradually to reduce the lattice parameter with distance from the silicon substrate, such that there will be a gradual variation in the relative concentrations. Thus, in one embodiment, where three $Al_xGa_{1-x}N$ layers will be utilized, in a first layer 308(a), x can comprise from about 0.9 to about 0.7. In a second $Al_xGa_{1-x}N$ layer 308(b), x can comprise from about 0.4 to about 0.6. and in a third $Al_xGa_{1-x}N$ layer 308(c), x can comprise from about 0.15 to 0.3.

Figure 3D:
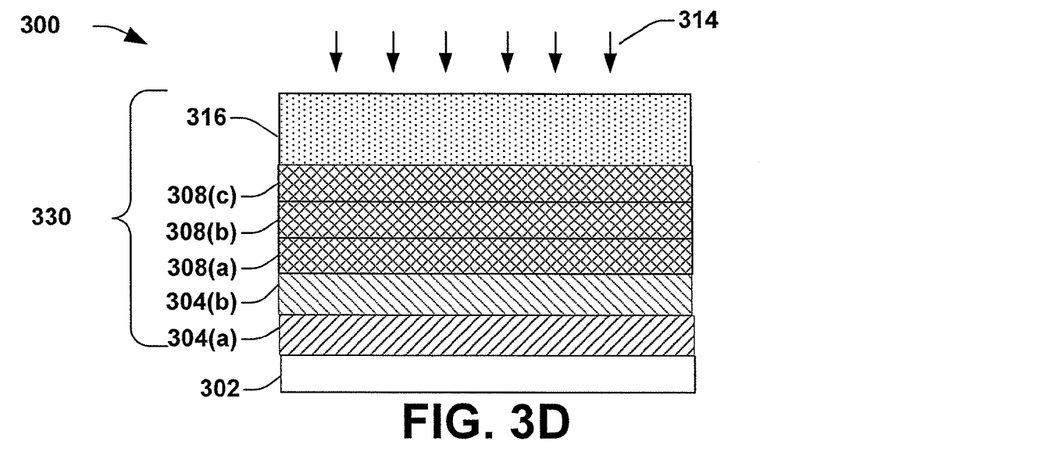

A superlattice structure 316 is then formed overlying second buffer region 308 by process 314, as illustrated in FIG. 3D. Superlattice structure 316 can be formed from repeating layer pairs of $Al_xGa_{1-x}N/Al_yGa_{1-y}N$. In one embodiment, the superlattice structure will include from about 20 to about 100 pairs of $Al_xGa_{1-x}N/Al_yGa_{1-y}N$. The repeating layer pairs can be formed at a temperature of from about 950° C. to about 1150° C. The two different layers of the repeating layer pair are deposited alternately on each other to form a periodic structure in the growth direction. The thickness of the $Al_xGa_{1-x}N$ layer can be, in one embodiment, from about 4 nm to about 8 nm, and the thickness of the $Al_yGa_{1-y}N$ layer of the repeating layer pair can be, in one embodiment, from about 15 nm to about 40 nm thick. The aluminum content of the repeating layer pair can be a graded aluminum content. Thus, in one embodiment, x of the $Al_xGa_{1-x}N$ layer can be from about 0.8 to about 1, and y of the $Al_yGa_{1-y}N$ layer can be from about 0.1 to about 0.3.

Figure 3E:
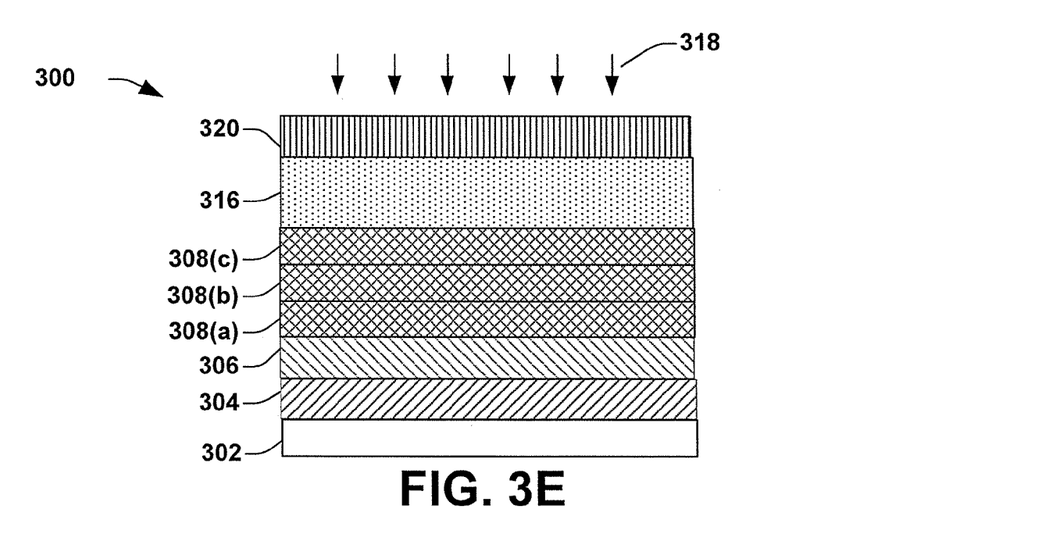

Following formation of the superlattice structure 316, as shown in FIG. 3E, a Group III nitride layer 320 can be formed overlying the superlattice structure 316. The Group III nitride layer 320 can be formed by deposition process 318, such as MOCVD, in one embodiment. In one embodiment, the Group III nitride layer 320 can be a GaN layer and will be formed at a temperature of about 1000° C. to about 1200° C. The thickness of the GaN layer can be from about 0.2 μm to about 5 μm.

Figure 3F:
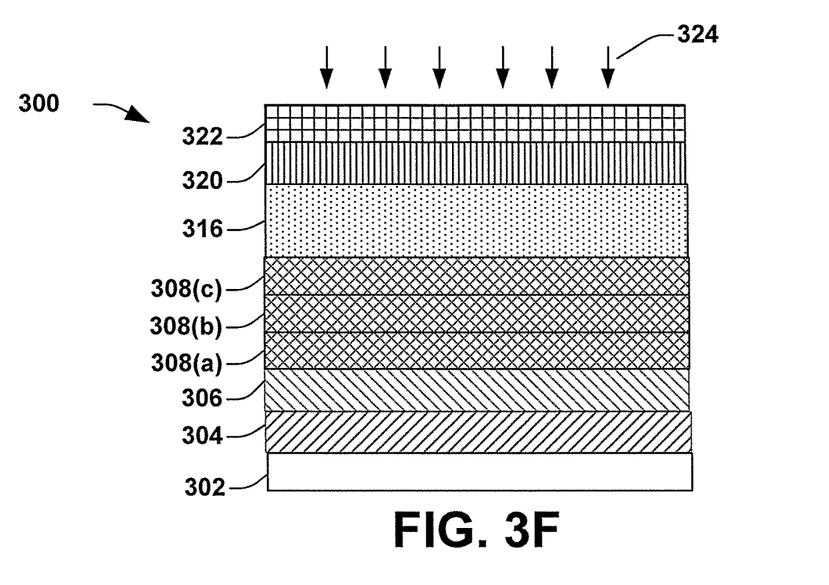

An active layer 322 can then be formed by process 324 overlying the Group III nitride layer 320, as illustrated in FIG. 3F. The active layer 322 can comprise, in one embodiment, an $AlN/Al_xGa_{x-1}N$ layer. The AlN of the active layer 332 can be formed at a thickness, in one embodiment, of from about 0.5 nm to about 1.5 nm and a temperature of about 1000° C. to about 1200° C. The $Al_xGa_{x-1}N$ of the active layer 322 can be formed at a thickness of from about 10 nm to about 40 nm, with x comprising from about 0.1 to about 0.3.

Figure 3G:
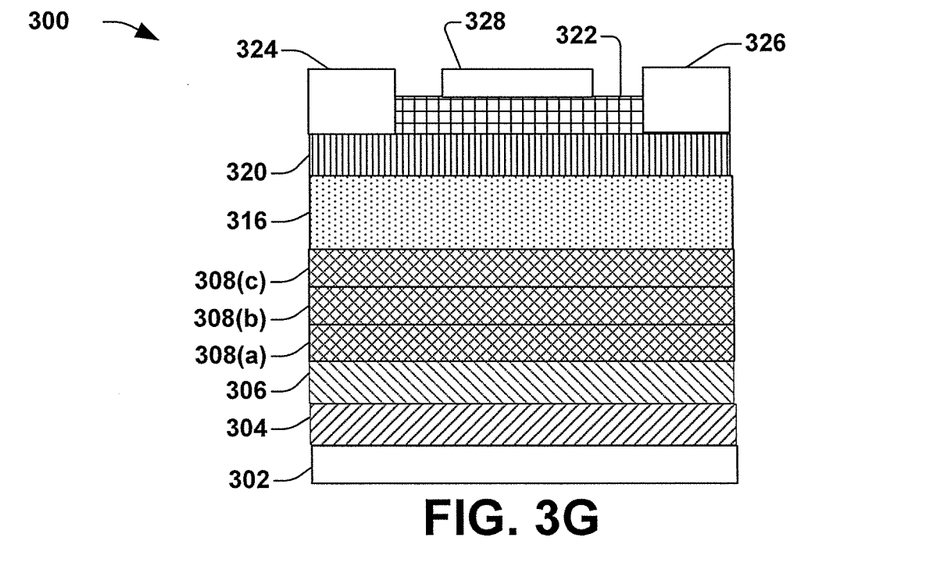

FIG. 3G illustrates formation of a high electron mobility transistor device (HEMT), which can be implemented on integrated circuit 300 for some technologies. A gate region 328 can be formed using metal deposition, photolithography patterning and etching processes. The source region 324 metal contacts and drain region 326 metal contacts are formed. This can be accomplished generally by one or more processes, including metal deposition, photolithography patterning and etching processes. Materials of the source 324 and drain 326 region are generally annealed after formation.

Figure 4:
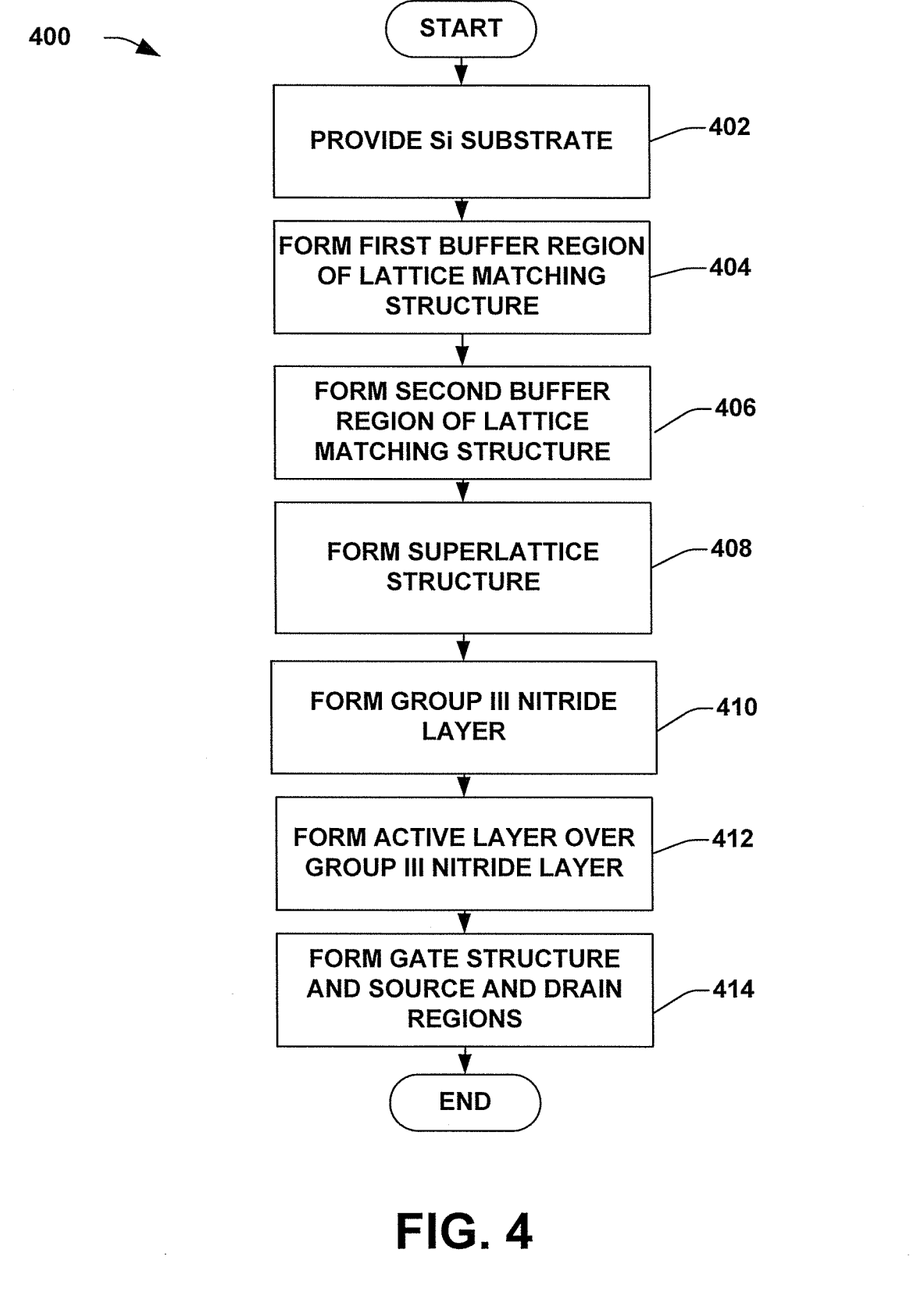
FIG. 4 illustrates a flow diagram of some embodiments of a method for the fabrication of an integrated circuit in accordance with the disclosure.

FIG. 4 illustrates a flow diagram of some embodiments of a method 400 for formation of a semiconductor structure according to an embodiment of the invention. While method 400 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At step 402 a silicon substrate is provided. A lattice matching structure is then formed over the substrate by forming a first buffer region at step 404.

At step 406, second buffer region of the lattice matching structure is formed overlying first buffer region.

A superlattice structure is then formed at step 408 overlying the second buffer region, followed by formation of a group III nitride layer overlying the superlattice structure at step 410.

An active layer is then formed over the group III nitride layer at 412. Source and drain regions and a gate structure are then formed at step 414. Interconnect layers can also be formed to interconnect the devices, as can other process steps, although these steps are omitted for simplicity. The method then ends.

It will be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

Therefore, the disclosure relates to an integrated circuit comprising a silicon substrate having a first lattice structure. The integrated circuit further comprises a group III nitride layer having a second lattice structure overlying the silicon substrate. Arranged between the silicon substrate and the group III nitride layer is a lattice matching structure which provides an interface between the first lattice structure of the silicon substrate and the second lattice structure of the group III nitride layer. The lattice matching structure comprises a first buffer region, a second buffer region and a superlattice structure of $Al_xGa_{1-x}N/Al_yGa_{1-y}N$ repeating layer pairs.

In a further embodiment, the disclosure relates to a method for the fabrication of a semiconductor structure comprising providing a silicon substrate. The method further comprises forming a lattice-matching structure on the silicon substrate, the lattice matching structure including a first buffer region, a second buffer region, and a superlattice structure comprising $Al_xGa_{1-x}N/Al_yGa_{1-y}N$ repeating layer pairs. The method further comprises forming a group III nitride layer overlying the lattice matching structure.

What is claimed is:

1. An integrated circuit comprising:
   a silicon substrate having a first lattice structure;
   a group III nitride layer overlying the silicon substrate and having a second lattice structure;
   a lattice-matching structure arranged between the silicon substrate and the group III nitride layer, comprising:
      a first buffer region disposed over the substrate and comprising a first aluminum nitride (AlN) layer in direct contact with a second AlN layer and with the silicon substrate;
      a second buffer region disposed over the first buffer region and comprising a plurality of graded $Al_xGa_{1-x}N$ layers in direct contact with one another and with the second AlN layer; and
      a superlattice structure comprising a first AlGaN layer in direct contact with one of the plurality of graded $Al_xGa_{1-x}N$ layers, a second AlGaN layer in direct contact with the first AlGaN layer, a third AlGaN layer in direct contact with the second AlGaN layer and a fourth AlGaN layer in direct contact with the third AlGaN layer, wherein the first AlGaN layer and the third AlGaN layer each have a first aluminum concentration that is greater than a second aluminum contraction of each of the second AlGaN layer and the fourth AlGaN layer.

2. The integrated circuit of claim 1, wherein the first AlN layer has a thickness from about 20 nm to about 80 nm, and the second AlN layer has a different thickness of from about 50 to about 200 nm.

3. The integrated circuit of claim 1, wherein the plurality of graded $Al_xGa_{1-x}N$ layers have aluminum content ranges distinct from one another.

4. The integrated circuit of claim 3, wherein the aluminum content of the second buffer region decreases continuously from a lower surface of a first graded $Al_xGa_{1-x}N$ layer abutting the first buffer region, to an upper surface of a subsequent graded $Al_xGa_{1-x}N$ layer abutting the superlattice structure.

5. The integrated circuit of claim 3, wherein x comprises from about 0.9 to about 0.7 in a first layer, x comprises from about 0.4 to about 0.6 in a second layer, and x comprises from about 0.15 to about 0.2 in a third layer.

6. The integrated circuit of claim 5, wherein the first layer comprises a thickness of from about 50 nm to about 200 nm, the second layer comprises a thickness of from about 150 nm to about 250 nm, and the third layer comprises a thickness of from about 350 nm to about 600 nm.

7. The integrated circuit of claim 1, wherein the first AlGaN layer and the third AlGaN layer have a smaller thickness than the second AlGaN layer and the fourth AlGaN layer.

8. The integrated circuit of claim 7, wherein the thickness of the first AlGaN layer and the third AlGaN layer is in a range of from about 4 nm to about 8 nm and the thickness of the second AlGaN layer and the fourth AlGaN layer is in a different rage of from about 15 nm to about 40 nm.

9. The integrated circuit of claim 1, wherein the group III nitride layer comprises a GaN layer.

10. The integrated circuit of claim 9, wherein the thickness of the GaN layer comprises from about 0.2 µm to about 5 µm.

11. A method of fabricating a semiconductor structure, comprising:
    providing a substrate;
    forming a lattice-matching structure on the substrate, the lattice-matching structure comprising:
       a first buffer region disposed over the substrate and comprising a plurality of aluminum nitride (AlN) layers in direct contact with one another and with the substrate,
       a second buffer region disposed over the first buffer region and comprising a plurality of graded $Al_xGa_{1-x}N$ layers in direct contact with one another and with one of the plurality of AlN layers, and
       a superlattice structure comprising a first AlGaN layer in direct contact with one of the plurality of graded $Al_xGa_{1-x}N$ layers, a second AlGaN layer in direct contact with the first AlGaN layer, a third AlGaN layer in direct contact with the second AlGaN layer and a fourth AlGaN layer in direct contact with the third AlGaN layer, wherein x is in a range of between greater than 0.8 and less than 1 and y is in a range of between greater than 0.1 and less than 0.3; and
    forming a group III nitride layer overlying the lattice-matching structure.

12. The method of claim 11, wherein forming the lattice-matching structure comprises forming the first buffer region by:
    forming a first layer of AlN onto and in direct contact with the substrate at a first temperature; and forming a second layer of AlN onto and in direct contact with the first layer of AlN at a second temperature greater than the first temperature.

13. The method of claim 11, wherein the plurality of graded AlGaN layers have distinct aluminum content ranges.

14. A semiconductor structure, comprising:
a semiconductor substrate;
a first buffer region disposed over the semiconductor substrate and comprising a plurality of AlN layers in direct contact with one another and with the semiconductor substrate;
a second buffer region arranged over the first buffer region and comprising a plurality of graded $Al_xGa_{1-x}N$ layers in direct contact with one another and with one of the plurality of AlN layers;
a superlattice structure comprising a first AlGaN layer in direct contact with one of the plurality of graded $Al_xGa_{1-x}N$ layers, a second AlGaN layer in direct contact with the first AlGaN layer, a third AlGaN layer in direct contact with the second AlGaN layer and a fourth AlGaN layer in direct contact with the third AlGaN layer, wherein x is in a range of between greater than 0.8 and less than 1 and y is in a range of between greater than 0.1 and less than 0.3; and
a group III nitride layer overlying the superlattice structure.

15. The integrated circuit of claim 1, wherein the first AlGaN layer and the third AlGaN layer have an aluminum concentration in a range of greater than 0.8 and less than 1 and the second AlGaN layer and the fourth AlGaN layer have an aluminum concentration in a range of greater than 0.1 and less than 0.3.

16. The integrated circuit of claim 1, further comprising:
a source region comprising a metal material and in direct contact with an upper surface of the group III nitride layer;
a drain region comprising the metal material and in direct contact with the upper surface of the group III nitride layer; and
an active layer in direct contact with the upper surface of the group III nitride layer and with sidewalls of the source region and the drain region.

17. The integrated circuit of claim 16, wherein the active layer is recessed below the source region and the drain region.

18. The integrated circuit of claim 16, wherein the active layer is $Al_xGa_{x-1}N$, where x is in a range of from about 0.1 to about 0.3.

19. The integrated circuit of claim 1, wherein the plurality of graded $Al_xGa_{1-x}N$ layers comprise a first graded $Al_xGa_{1-x}N$ layer, a second graded $Al_xGa_{1-x}N$ layer, and a third graded $Al_xGa_{1-x}N$ layer, wherein the third graded $Al_xGa_{1-x}N$ layer has a greater thickness than the first graded $Al_xGa_{1-x}N$ layer and the second graded $Al_xGa_{1-x}N$ layer.

20. The integrated circuit of claim 1, wherein an aluminum content of the first AlGaN layer is a graded aluminum content.

* * * * *